(12) United States Patent
Sadaka et al.

(10) Patent No.: US 6,803,248 B2
(45) Date of Patent: Oct. 12, 2004

(54) CHEMISTRY FOR ETCHING QUATERNARY INTERFACE LAYERS ON INGAASP MOSTLY FORMED BETWEEN GAAS AND INXGA(1-X) P LAYERS

(75) Inventors: Mariam G. Sadaka, Phoenix, AZ (US); Jonathan K. Abrokwah, Scottsdale, AZ (US)

(73) Assignee: Freescale Semiconductor, Inc., Schaumburg, IL (US)

(*) Notice: Subject to any disclaimer, the term of this patent is extended or adjusted under 35 U.S.C. 154(b) by 265 days.

(21) Appl. No.: 10/029,093

(22) Filed: Dec. 21, 2001

(65) Prior Publication Data

US 2003/0138984 A1 Jul. 24, 2003

(51) Int. Cl.$^7$ .............................................. H01L 21/00
(52) U.S. Cl. ...................... 438/47; 438/197; 438/235; 438/285; 438/689; 438/745
(58) Field of Search .......................... 438/47, 197, 235, 438/285, 689, 745

(56) References Cited

U.S. PATENT DOCUMENTS 6,594,297 B1 * 7/2003 Hayakawa ................... 372/46

2002/0009894 A1 * 1/2002 Chino ........................ 438/712

FOREIGN PATENT DOCUMENTS

| JP | 63-142302 | | 12/1989 | ................ 21/308 |
| JP | 01-033962 | | 8/1990 | ................ 21/308 |
| JP | 2001-023951 A | | 1/2001 | ................ 21/306 |
| JP | 2001-229584 | * | 1/2003 | |
| JP | 2001-317714 | * | 5/2003 | |

* cited by examiner

Primary Examiner—Long Pham
(74) Attorney, Agent, or Firm—Fortkort Grether + Kelton LLP; John A. Fortkort (57) ABSTRACT

A method is provided for etching quaternary interface layers of $In_xGa_{1-x}As_yP_{1-y}$ which are formed between layers of GaAs and InGaP in heterojunction bipolar transistors (HBTs). In accordance with the method, the interface is exposed by etching the GaAs layer with an etchant that is selective to InGaP. The interface is then etched with a dilute aqueous solution of HCl and $H_2O_2$ that is selective to InGaP. The controlled etching provided by this methodology allows HBTs to be manufactured with more sophisticated, near ideal designs which may contain multiple GaAs/InGaP interfaces.

35 Claims, 4 Drawing Sheets

CHEMISTRY FOR ETCHING QUATERNARY INTERFACE LAYERS ON INGAASP MOSTLY FORMED BETWEEN GAAS AND INXGA(1-X) P LAYERS

FIELD OF THE INVENTION

The present invention relates generally to the chemical etching of inorganic substrates, and more particularly to the chemical etching of quaternary interface layers of InGaAsP.

BACKGROUND OF THE INVENTION

Heterojunction Bipolar Transistors (HBTs) are very high performance transistors which, unlike conventional bipolar transistors, are built using more than one semiconductor material (hence the term "heterojunction"). These transistors are constructed to take advantage of the different bandgaps of the semiconductor materials that are used to form the emitter, base and collector portions of the device. Such semiconductor materials include n-AlGaAs/p-GaAs/n-GaAs, or SiGe in combination with Si. HBTs may be formed using high precision epitaxy, such as Molecular Beam Epitaxy (MBE) or Metal-Organic Chemical Vapor Deposition (MOCVD).

Currently, AlGaAs/GaAs HBTs are the fastest growing segment of the semiconductor industry. However, over the next several years, InGaP/GaAs technology is expected to overtake AlGaAs/GaAs, due to its superior electrical characteristics and reliability. This fact has been recognized in the art. Thus, for example, U.S. Pat. No. 6,043,520 (Yamamoto) notes that elimination of Al from the emitter layer and ballast resistor layer of these devices reduces the amount of impurities trapped during crystal growth. This, in turn, prevents the deterioration of current stability which may arise from such impurities, thus improving the reliability of the transistor.

InGaP/GaAs-based HBTs also offer high-speed, low power performance due to the inherent electron transport characteristics of their component materials, characteristics which include high electron mobility and high peak electron drift velocities. Moreover, the small surface recombination velocities in InGaP are advantageous for fabricating submicron emitter devices for high-speed, high-density integrated circuits without serious degradation in current gain. In addition, InP-based HBTs are very attractive for applications to optoelectronic integrated circuits due to their ability to be integrated with long-wavelength optical devices. The InGaP/GaAs heterojunction is also less prone to oxidation than are AlGaAs/GaAs systems, a consideration which facilitates regrowth and device processing of InGaP HBTs.

To fully exploit the advantages of InGaP/GaAs technology, however, it is necessary to develop suitable processing techniques for their manufacture, including wet and dry etching techniques. Selective wet etching is preferred in the manufacture of these systems, since InGaP needs to be selectively etched on top of the base layer with a minimum of imposed damage. The base contact is subsequently formed on the base surface. Any damage to the base surface caused, for example, by non-selective etching will degrade the performance and carrier lifetime of the device. The emitter epitaxial layer may be considerably complex, requiring selective wet etch of multiple layers, including interfacial layers.

Various etching systems, including both wet and dry techniques, are known to the semiconductor art, and some of these have found application in the manufacture of devices containing GaAs and/or InGaP layers. Thus, for example, solutions of $H_2O_2$ have been used to selectively etch InGaAs in the presence of either InAlAs or InP.

Methodologies are also known in which hydrogen peroxide and an acid are used in a two-step etching cycle for gallium arsenide. In these methodologies, the acid and hydrogen peroxide are applied in separate steps, and care is taken to rinse between applications of the two.

In one known method for making heterojunction bipolar semiconductor devices, an aqueous solution of phosphoric acid ($H_3PO_4$) and hydrogen peroxide ($H_2O_2$) is used to etch a GaAs emitter passivation layer overlying an emitter layer of InGaP. Apparently, the solution does not etch InGaP, so that the etching stops at the surface of the InGaP emitter layer.

Photochemical etching processes are also known which have been applied to n-type gallium arsenide substrates. In some of these processes, hydrogen peroxide solutions have been used to treat a variety of III–V compound semiconductors containing aluminum. There have been suggestions that some of these solutions can be made acidic through the addition of HCl.

Unfortunately, the commercial development of InGaP/GaAs-based HBTs has been hindered for several years by the lack of commercially feasible processes for reliably etching InGaP/GaAs interfaces. While processes and chemistries are known which can be used for etching either InGaP or GaAs alone, the quality and consistency of the etch becomes an issue when it is necessary to etch across an InGaP/GaAs interface. It has therefore been difficult prior to the present invention to reliably manufacture InGaP/GaAs-based HBTs on a commercial scale. This is especially true with devices having multiple InGaP/GaAs interfaces. However, such multiple interface devices are otherwise highly desirable because of the processing flexibility they afford.

Some attempts have been made to avoid these issues by altering the design of the HBT so that InGaP/GaAs interfaces are avoided, or so that the effects of uneven etching across these interfaces is minimized. However, these approaches tend to compromise the design of device parameters which are critical to the performance and reliability of the device, leading to a less functional product with less than ideal characteristics.

There is thus a need in the art for a method for manufacturing HBTs based on InGaP/GaAs which overcomes these deficiencies, and which allows HBTs to be manufactured with more sophisticated, near ideal designs. These and other needs are met by the present invention, as hereinafter described.

SUMMARY OF THE INVENTION

The present invention relates generally to the chemical etching of inorganic substrates. Upon careful investigation, it has now been found that the consistency of an etch across an InGaP/GaAs interface can be dramatically affected by problematic traces of InGaAsP which are present along the interface. These traces of InGaAsP can occur at varying thicknesses, and etch at a different rate than the underlying substrate. Consequently, etching times can vary widely from one device to the next, even within the same product lot, so that the adoption of standardized etching times results in some devices being under-etched and others being over-etched. Moreover, even within a single device, the unevenness of the thickness of the InGaAsP formations may result in some portions of the interface which are under-etched, and other portions which are over-etched.

Surprisingly, it has been found that these infirmities can be overcome, and the consistency of the etch can be dramatically improved, by removing the InGaAsP deposits occurring along the GaAs/InGaP interface through the use of the methodologies described herein. By so doing, the consistency of an etch across an InGaP/GaAs interface can be greatly improved, and standardized etching times can be adopted. Moreover, HBTs can be reliably manufactured in accordance with the invention on a commercial scale, and these devices can be fabricated with more sophisticated, near ideal designs which may contain multiple GaAs/InGaP interfaces.

In one aspect, the present invention relates to a method for fabricating a semiconductor device. In accordance with the method, a substrate is provided which contains a first layer comprising GaAs and a second layer comprising InGaP, wherein the first and second layers are joined across a common interface comprising InGaAsP. The InGaAsP will typically have the formula $In_xGa_{1-x}As_yP_{1-y}$, wherein $0<x$, $y<1$. Similarly, the InGaP layer may have the general formula $In_xGa_{(1-x)}P$, where $0<x<1$. The substrate may be a field effect transistor, such as, for example, a heterojunction bipolar transistor. The first layer is etched with a first liquid composition until at least a portion of the interface is exposed, and the exposed interface is then etched with a second composition comprising an oxidizing agent disposed in a liquid medium. The first composition may be, for example, a solution of $H_3PO_4/HCl/H_2O$, citric acid/$H_2O_2$, or $H_3PO_4/HCl$, while the second composition may be, for example, an aqueous solution of $HCl/H_2O_2$. Preferably, the second solution is a dilute aqueous solution. The second solution also preferably exhibits etch stop behavior with respect to InGaP. The ability of the second liquid to etch stop on InGaP gives rise to substantial process flexibility, and allows for a more controlled manner by which the emitter can be defined. This methodology also allows HBTs to be manufactured with more sophisticated, near ideal designs which may contain multiple GaAs/InGaP interfaces.

In another aspect, the present invention relates to a method for etching a substrate, comprising the steps of providing a substrate comprising formations of $In_xGa_{1-x}As_yP_{1-y}$, wherein $0<x$, $y<1$, and etching the InGaAsP formations with a composition comprising an oxidizing agent disposed in a liquid medium. Preferably, the composition is a dilute acidic peroxide solution, such as a dilute aqueous solution of $HCl/H_2O_2$. The substrate may comprise epitaxial layers comprising GaAs and InGaP, and these epitaxial layers may have a common interface comprising InGaAsP.

In still another aspect, the present invention relates to a method for fabricating a semiconductor device. In accordance with the method, a Group III–V compound heterostructure is fabricated which includes contiguous first and second epitaxial layers having different compositions, and in which the first and second layers comprise GaAs and InGaP, respectively. The first and second layers have disposed between them an interface comprising InGaAsP. The heterostructure is subjected to a first etchant that selectively etches the first layer, and is then subjected to a second etchant that selectively etches the interface. The second etchant comprises an aqueous solution of $H_2O_2$ and has a pH of less than 7, preferably within the range of about 5 to less than 7, and more preferably within the range of about 5 to about 6.5.

These and other aspects of the present invention are described in further detail below.

DETAILED DESCRIPTION

In accordance with the present invention, a method for the chemical etching of HBTs and other field effect transistors and semiconductor devices is provided. The method provides a highly reliable fabrication route for the production of quality semiconductor devices based on GaAs/InGaP.

One aspect of the present invention relates to the provision of an acidic solution of an oxidizing agent, such as a dilute aqueous solution of $H_2O_2/HCl$, that can be used to reliably etch interfaces existing between GaAs/InGaP layer pairs. Such interfaces are typically characterized by varying concentrations of InGaAsP which occur at varying thicknesses along the interface. These InGaAsP concentrations can have varying compositions, which can be represented by the general formula $In_xGa_{1-x}As_yP_{1-y}$, wherein $0<x$, $y<1$. The etching solutions used to etch these interfaces in accordance with the present invention selectively remove the interface, and also preferably etch stop on InGaP, thus providing a fresh surface for any subsequent InGaP wet etches.

The etching solutions used in accordance with the present invention to etch the GaAs/InGaP interfaces are especially advantageous in the manufacture of GaAs/InGaP HBTs and other field effect transistors. The robustness of the etch achieved with these solutions allows for the implementation of more sophisticated, near-ideal HBT designs utilizing multiple InGaP layers and multiple GaAs/InGaP interfaces. These multiple interfaces may then be exploited to provide convenient etch stops throughout the process, thus adding to the repeatability and robustness of the process, and making the manufacturing process easier to control and less dependent on substrate uniformities. By contrast, most prior art methods deal with InGaP/GaAs interface issues either by avoiding the instance of such interfaces to begin with, or by compromising the design of device parameters to less optimal designs so as to minimize the effect of these interfaces.

Although the etching solutions used in accordance with the present invention to etch the GaAs/InGaP interfaces are especially advantageous in the manufacture of GaAs/InGaP HBTs and other field effect transistors, they may also be utilized more generally to etch GaAs/InGaP interfaces in any substrate or semiconductor device in which such interfaces may occur. These solutions may also be used in general to etch InGaAsP concentrations or deposits wherever such concentrations or deposits may occur.

Another aspect of the present invention relates to the processing steps which occur prior and subsequent to the interface etch. Preferably, the interface is first exposed for etching by etching the overlying layer with a solution that exhibits etch stop behavior with respect to the underlying layer. This solution preferably also exhibits etch stop behavior with respect to the interface as well. The underlying layer may then be etched subsequent to the interface etch with an appropriate etching solution or by other suitable means. Thus, for example, if the overlying layer is GaAs and the underlying layer is InGaP, the GaAs may be etched with a solution such as citric acid/$H_2O_2$ (described in greater detail below) which effectively etches GaAs but etch stops on InGaP, thus exposing the interface for further processing. After the interface has been etched as described above, the underlying InGaP layer may be etched with a $H_3PO_4$/HCl solution (described in greater detail below), or by other suitable means.

The solutions used for chemical etching in accordance with the present invention will typically contain a liquid medium. Such a liquid medium may comprise various organic and/or inorganic liquids or solvents as are known to the art, or mixtures of such liquids or solvents. These include, for example, various liquid fluorocarbons or hydroflurocarbons. These liquids or solvents may be chosen on the basis of their ability to solubilize the reactants in the etching solution and/or the byproducts of the etching process, including the various inorganic oxides or salts that may be generated during the etching process by the action of the etching solution on the substrate. Preferably, however, the etching solution is an aqueous solution. In the case of a solution intended for use as an interface etch, the etching solution is preferably a dilute aqueous solution.

The solutions used for chemical etching in accordance with the present invention may also contain an oxidizing agent. Various oxidizing agents may be used in this capacity, with the particular choice depending on such factors as the materials being etched and the desired etching rate and selectivities. Such oxidizing agents may include, for example, hydrogen peroxide and other peroxides, including organic peroxides. It may also be possible in some situations to utilize a liquid medium that is itself an oxidizing agent. UV light may also be employed to affect or promote oxidation. Preferably, however, hydrogen peroxide ($H_2O_2$) is used as the oxidizing agent, based in part on its availability, ease of handling, and the selectivities it affords when used in combination with certain acids.

Various acids may also be employed in the solutions used for chemical etching in accordance with the present invention. While various Lewis acids can be used in this capacity, the acids used in the practice of the present invention are preferably protic acids such as, for example, hydrochloric acid, sulfuric acid, nitric acid, phosphoric acid, acetic acid, citric acid, hydrogen fluoride, and halooxoacids, such as those having ions represented by the formula $(XO_n)^{p-}$ wherein X is a halogen element, n is 3, 4 or 6, and p is 1, 2 or 3. Various mixtures of the aforementioned acids may also be used. Of these various acids, hydrochloric acid is especially preferred for solutions used to etch GaAs/InGaP interfaces. Citric acid is useful for etching InGaAs and GaAs substrates, and is especially useful for etching GaAs layers at a GaAs/InGaP interface, due to the etch stop behavior it exhibits with respect to InGaP under the proper conditions.

$H_3PO_4$/HCl mixtures are useful for etching InGaP substrates, since these acid mixtures readily etch InGaP substrates having varying degrees of disorder. Consequently, the use of $H_3PO_4$/HCl mixtures cause the emitter wet etch module to be very robust.

The ratios of acid, oxidizing agent and other components of the etching solutions used in the practice of the present invention can vary, depending in part on the etching conditions (e.g., temperature), the desired rate of etch and the selectivities required. Thus, for example, in $H_2O_2$/HCl solutions used to etch GaAs/InGaP interfaces, the volumetric ratios of $H_2O_2$:HCl will typically be in the range of about 1:5 to about 5:1, preferably within the range of about 1:3 to about 3:1, more preferably within the range of about 1:3 to about 1:1, and most preferably about 1:2. For $H_3PO_4$/HCl mixtures utilized in the practice of the present invention, typical $H_3PO_4$:HCl volumetric ratios are within the range of about 1:10 to about 10:1, preferably within the range of about 1:5 to about 5:1, more preferably within the range of about 1:1 to about 2:1, and most preferably about 3:2. Citric acid/$H_2O_2$ solutions utilized in the practice of the present invention will typically have citric acid:$H_2O_2$ volumetric ratios within the range of about 1:10 to about 10:1, preferably within the range of about 1:1 to about 10:1, more preferably within the range of about 1:1 to about 5:1, and most preferably about 3:1. These ranges of volumetric ratios assume that the mixtures are created from a 12.2M aqueous solution of HCl; a 2.9M aqueous solution of $H_2O_2$; a 14.8M aqueous solution of $H_3PO_4$; and a 0.57M aqueous solution of citric acid. One skilled in the art will appreciate that these etching solutions can be created from more dilute or more concentrated versions of the component solutions through appropriate adjustment of the volumetric ratios. In some instances, it may be desirable to use an even more dilute or more concentrated citric acid solution.

On a mole ratio basis, in the $H_2O_2$/HCl solutions used to etch GaAs/InGaP interfaces in accordance with the present invention, the mole ratios of $H_2O_2$:HCl will typically be in the range of about 1:20 to about 5:4, preferably within the range of about 1:12 to about 3:4, more preferably within the range of about 1:12 to about 1:4, and most preferably about 1:8. For $H_3PO_4$/HCl mixtures used in the practice of the present invention, typical $H_3PO_4$:HCl mole ratios are within the range of about 1:8 to about 25:2, preferably within the range of about 1:4 to about 25:4, more preferably within the range of about 5:4 to about 5:2, and most preferably about 15:8. Citric acid/$H_2O_2$ solutions used in the practice of the present invention will typically have citric acid:HCl mole ratios within the range of about 1:50 to about 2:1, preferably within the range of about 1:5 to about 2:1, more preferably within the range of about 1:5 to about 1:1, and most preferably about 3:5.

Varying amounts of the liquid media and solvents noted above may be employed in the etch solutions used in the practice of the present invention. The amounts of liquid media used may depend on such factors as the required speed of the etch and the selectivity desired. In the case of the solutions used to etch GaAs/InGaP interfaces, however, these solutions are preferably dilute solutions with respect to both the acid and the oxidizing agent. Thus, for example, when the etching solution used to etch the interface is an aqueous mixture of $H_2O_2$ and HCl, the volumetric ratio of water to $H_2O_2$ (assuming a 12.2M aqueous solution of HCl and a 2.9M aqueous solution of $H_2O_2$) will typically be at least about 5:1, preferably greater than about 15:1, more preferably at least about 20:1, and most preferably within the range of about 20:1 to about 50:1, and the concentration of $H_2O_2$ in the resulting solution will typically be less than about 0.36M, preferably less than about 0.16M, more preferably less than about 0.13M, and most preferably within the range of about 0.05M to about 0.13M. The concentration of HCl in the resulting solution will typically be less than about 1.44M, preferably less than about 0.64M, more preferably less than about 0.52M, and most preferably within the range of about 0.20M to about 0.52M. In the most preferred embodiment, the solution used to etch the interface is an aqueous solution of hydrogen peroxide and HCl having the volumetric ratios $H_2O_2$:HCl:$H_2O$ of about 1:2:20, and in which the concentrations of HCl and $H_2O_2$ are about 0.02M and 0.13M, respectively.

EXAMPLES 1–10

The following examples illustrate the effectiveness of different etch chemistries at etching the GaAs layer of a GaAs/InGaP layer pair.

A number of different aqueous solutions were evaluated in terms of their ability to etch the GaAs layer of a GaAs/InGaP layer pair at ambient conditions. Three different mixtures, at varying component ratios, were evaluated, including an $H_3PO_4$/HCl/$H_2O$ solution, a citric acid/$H_2O_2$ solution, and a $H_3PO_4$/HCl solution. The volumetric ratios of the aforementioned ingredients are indicated in TABLE 1. The mixtures were derived by mixing together, at the indicated ratios, appropriate volumes of a 12.2M aqueous solution of HCl, a 2.9M aqueous solution of $H_2O_2$, a 14.8M aqueous solution of $H_3PO_4$, and a 0.57M aqueous solution of citric acid.

TABLE 1

GaAs Etch Chemistries

| EXAMPLE | $H_3PO_4$ | HCl | Citric Acid | $H_2O$ | $H_2O_2$ |
|---------|-----------|-----|-------------|--------|----------|
| 1 | 1 | 1 | — | 1 | — |
| 2 | 3 | 1 | — | 1 | — |
| 3 | 3 | 1 | — | 2 | — |
| 4 | — | — | 6 | — | 1 |
| 5 | — | — | 5 | — | 1 |
| 6 | — | — | 4 | — | 1 |
| 7 | — | — | 3 | — | 1 |
| 8 | 1 | 1 | — | — | — |
| 9 | 3 | 1 | — | — | — |
| 10 | 3 | 2 | — | — | — |

All ten mixtures tested were found effective at etching the GaAs layer and exhibited selectivity to InGaP. None of these mixtures were effective at etching the InGaAsP interface. Hence, all nine solutions are candidates for etching the GaAs layer of a GaAs/InGaP layer pair in a GaAs/InGaP HBT.

EXAMPLES 11–14

The following examples illustrate the effect that varying the volumetric ratios of HCl, $H_2O_2$ and $H_2O$ in the etching solution has on the etching behavior of the solution toward the InGaAsP interface existing between a GaAs/InGaP layer pair.

Four different aqueous HCl/$H_2O_2$/$H_2O$ solutions containing varying volumetric ratios of HCl, $H_2O_2$ and $H_2O$ were evaluated in terms of their ability to etch the interface layer of a GaAs/InGaP layer pair in an HBT at ambient conditions. The volumetric ratios of HCl, $H_2O_2$ and $H_2O$ in each mixture is indicated in TABLE 2. These mixtures were derived by mixing together, at the indicated ratios, volumes of a 12.2M aqueous solution of HCl, a 2.9M aqueous solution of $H_2O_2$, and water.

TABLE 2

GaAs/InGaP Interface Etch Chemistries

| EXAMPLE | HCl | $H_2O$ | $H_2O_2$ |
|---------|-----|--------|----------|
| 11 | 2 | 20 | 1 |
| 12 | 2 | 15 | 1 |
| 13 | 2 | 5 | 1 |
| 14 | 2 | 2 | 5 |

The solution of EXAMPLE 11 worked best, and exhibited etching characteristics that were the most controllable and repeatable. The solution was highly selective to InGaP, removed all InGaAsP formations from the interface, and left a clean surface of InGaP for the subsequent etching step. The solutions of EXAMPLES 12–14 were less desirable in that they did not exhibit as good of a selectivity to InGaP.

In addition to the materials noted above, various other additives and agents may also be added to the etching solutions used to implement the methodology of the present invention. These include, for example, complexing agents such as EDTA (ethylenediaminetetraacetic acid), surfactants, stabilizers, buffers, and other such materials. For example, it may be desirable in some instances to buffer the citric acid solutions used in the practice of the present invention with potassium citrate or another suitable buffer.

Various instruments and techniques may be applied to facilitate or monitor the various etching processes contemplated by the present invention. Thus, for example, SE (Spectroscopic Ellipsometry) may be advantageously employed as a nondestructive monitoring technique for checking the thickness and composition of epitaxial layers at various points during the process. For emitter wet etches, the thickness and composition of the unetched layers may be checked using SE after every etch. This method confirms the completion of the etches, and flags any wafers with incomplete etching.

Figures 1, 2, 3:
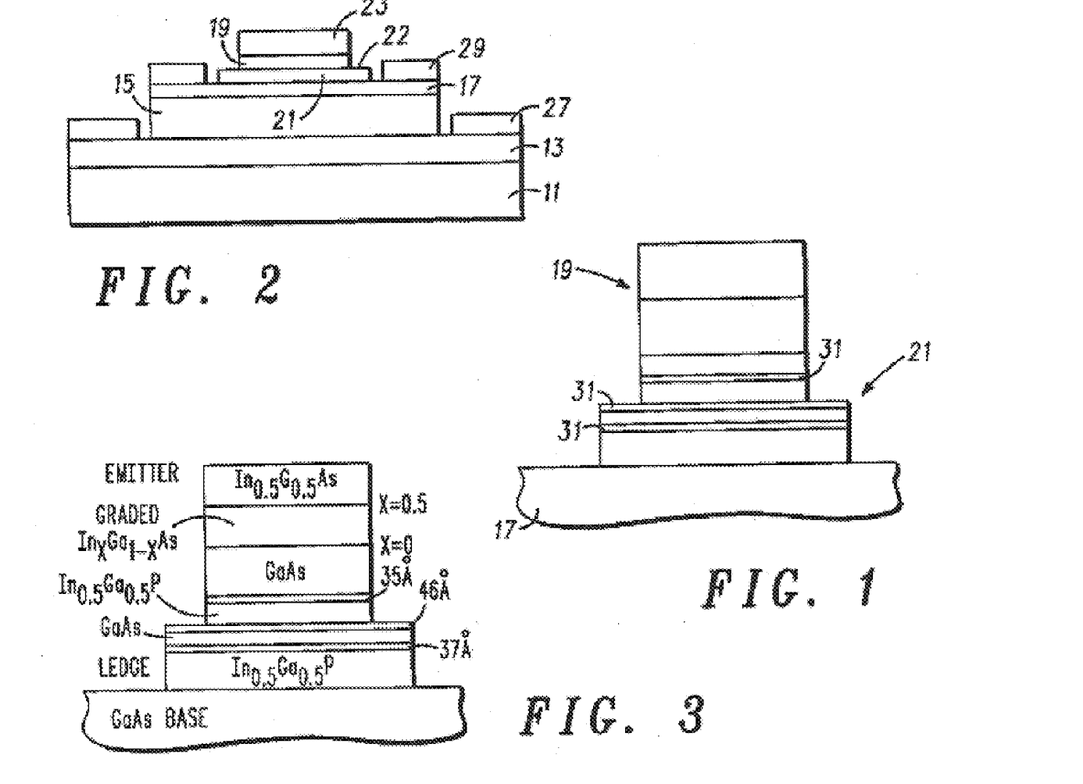
FIGS. 1–2 are cross-sectional illustrations depicting the structure of the base, ledge and emitter portions of a GaAs/InGaP HBT.
FIG. 3 is a cross-sectional illustration depicting the composition of the base, ledge and emitter portions of one embodiment of a GaAs/InGaP HBT, and the location of the interface layers in the device.

FIGS. 1–2 are cross-sectional illustrations of an example of an HBT based on InGaP/GaAs which may be fabricated in accordance with the methodology of the present invention. The HBT consists of a semi-conducting substrate 11 on which is disposed an $n^+$ subcollector 13, an n-collector 15, a high carbon-doped base 17, and an emitter 19. The emitter may be defined by a series of subsequent selective wet etches. A ledge 21 having InGaP surface passivation 22 is disposed between the emitter and the carbon-doped base. The ledge may be formed, for example, by deposition and patterning of a dielectric material such as silicon nitride, and typically has a depth of about 400 Å. The surface passivation of the ledge reduces recombination currents at the edge of the emitter base structure which can adversely affect device performance, and is also employed as a hard mask in the subsequent etching steps required to complete the rest of the emitter and to expose the base layer.

A refractory emitter contact or electrode 23, which may consist, for example, of TiWN sputtered on InGaAs, is disposed on the emitter, and is in contact with a low parasitic Au airbridge (not shown). A collector contact 27 or electrode is disposed on an exposed surface of the subcollector, and a non-alloyed base contact 29 or electrode is disposed on an exposed surface of the carbon-doped base. The base contact or electrode, which is typically formed from a TiPtAu non-alloyed material, may be defined by lift-off with the assistance of a non-dielectric material or photoresist. Various solvents may be used to effect the dissolution of the non-dielectric material or photoresist in the lift-off process.

Figure 4:
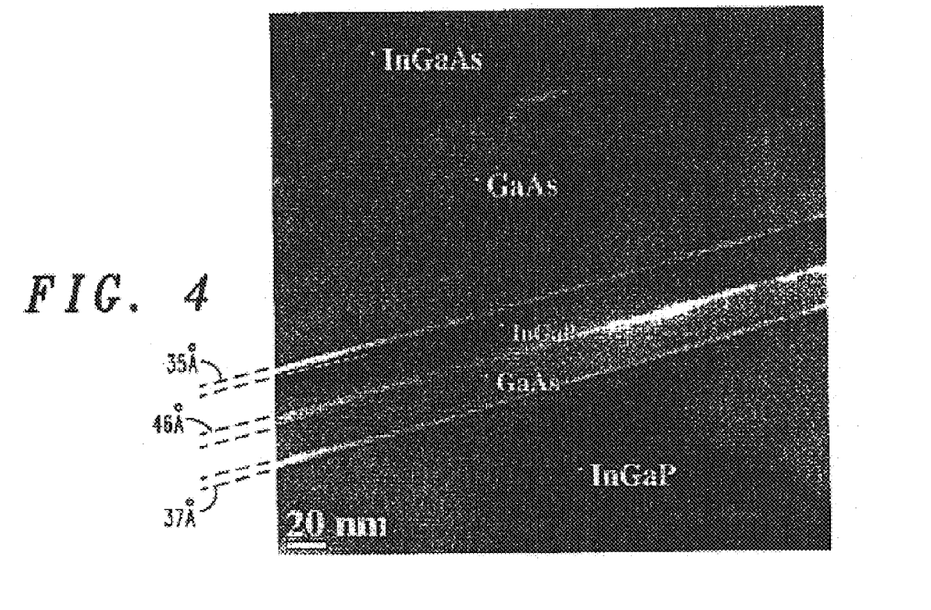
FIG. 4 is a transmission electron micrograph of the interface layers in the base, ledge and emitter portions of a GaAs/InGaP HBT.

The emitter wet etch process for the device depicted in FIGS. 1–2 involves selectively etching six epitaxial layers with three InGaAsP interface layers. The composition of the epitaxial layers in a typical configuration, and the disposition of the interface layers, is depicted in FIGS. 1, 3 and 4, and the chemistry used to etch each layer in this device is described in TABLE 3 (the sequence of layers in TABLE 3 is from the top of the device to the bottom). The thickness of each of these layers is typically within the range of about 500 Å to about 1000 Å.

TABLE 3

Etch Chemistries for a Preferred Embodiment

| Step No. | Etch Steps | Chemistry | Volumetric Ratios |
|---|---|---|---|
| 1 | $In_{0.5}Ga_{0.10}s$/Graded $In_{0.5}Ga_{0.10}s$/GaAs | citric acid: $H_2O_2$ | 3:1 |
| 2 | Interface | $H_2O_2$:HCl:$H_2O$ | 1:2:20 |
| 3 | 1st $In_{0.5}Ga_{0.5}P$ | $H_3PO_4$:HCl | 3:2 |
| 4 | Ledge Formation | — | — |
| 5 | Interface/GaAs/Interface | $H_2O_2$:HCl:$H_2O$ | 1:2:20 |
| 6 | 2nd $In_{0.5}Ga_{0.5}P$ | $H_3PO_4$:HCl | 3:2 |

Using TiWN as a mask, the InGaAs/graded InGaAs/GaAs layer series is etched first with a 3:1 citric acid:peroxide solution (by volume, using the citric acid and peroxide solutions noted in EXAMPLES 1–10), which selectively stops on the top InGaP layer. This etch is very reliable and exhibits a virtually infinite selectivity to InGaP.

Etching of InGaP itself is much more troublesome, and has been one of the major challenges in the manufacture of InGaP HBTs. While compositions are known which are capable of etching InGaP itself, the interfaces (see, e.g., FIGS. 3 and 4) between adjacent layers of GaAs and InGaP in HBT preforms typically contain concentrations of InGaAsP which vary in both thickness and composition (these formations have the general composition $In_xGa_{1-x}As_yP_{1-y}$, wherein 0<x, y<1). Such formations mask the etching of the underlying layers. As a result, an etch of very poor uniformity is obtained. This is problematic for multiple reasons. First of all, the presence of unetched InGaP on the ledge and in other areas where it is intended to be removed gives rise to high base contact resistance, which can render the device inoperable. Moreover, the liquid etches that are typically used to define the ledge etch isotropically. Hence, the presence of unetched InGaP requires an unpredictable amount of additional etching for its removal, which undercuts the ledge and makes it difficult to control its overall length. This, in turn, adversely affects the gain characteristics of the resulting device.

Figures 5, 6:
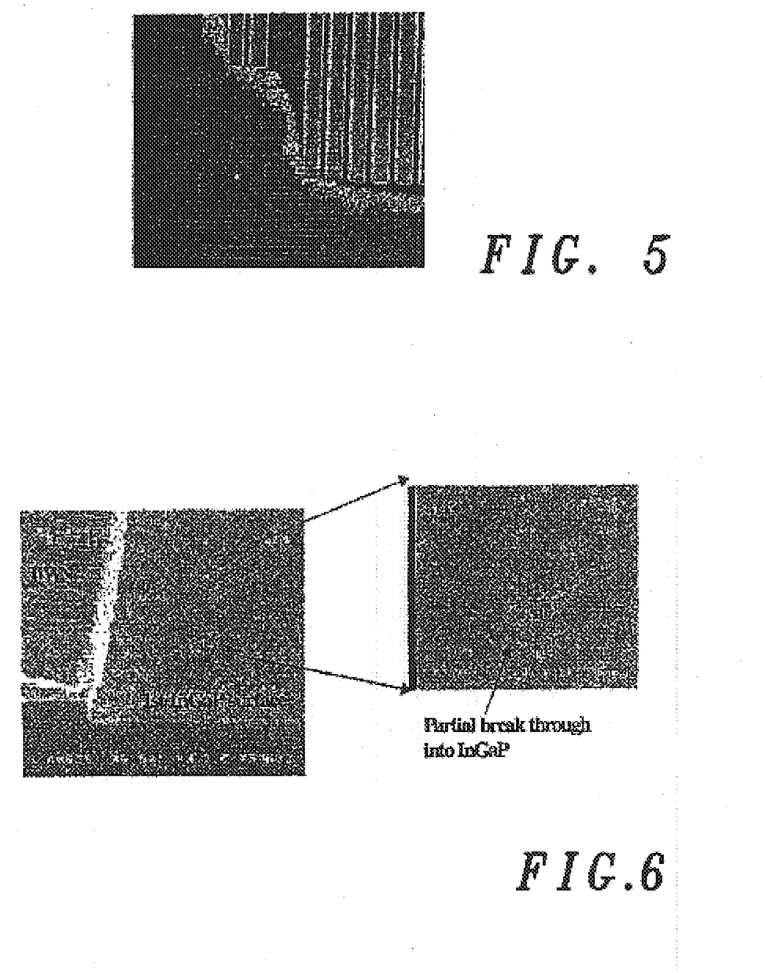
FIGS. 5–6 are transmission electron micrographs demonstrating the effect that the presence of interfaces has on the etch.
Figure 7:
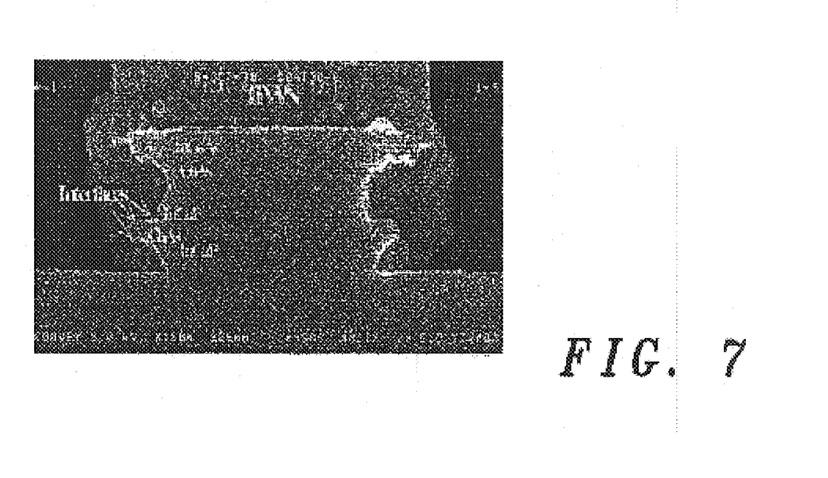
FIGS. 7–8 are transmission electron micrographs showing, respectively, an emitter profile formed with no interface etching and an emitter profile formed with interface etching.

The difficulties resulting from the application of conventional etching methodologies in the formation of GaAs/InGaP HBTs is illustrated in the micrographs of FIGS. 5–7. FIG. 5 is a top view of the etched wafer, and shows the plurality of longitudinal "fingers" of the TiWN masked portions defining the emitters, which are separated by valleys of the unmasked InGaP substrate. FIG. 6 is a perspective view showing the exposed InGaP surface at higher magnification. In the system depicted in the micrographs, a solution of citric acid/$H_2O_2$ (3:1 by volume, using the citric acid and $H_2O_2$ solutions noted in EXAMPLES 1–10) was used to etch the GaAs layer of a GaAs/InGaP layer pair in the emitter portion of an HBT. Since the citric acid/$H_2O_2$ solution is selective to the InGaP layer as well as the concentrations of InGaAsP formed along the interface, this etch exposes a surface of the InGaP layer which is covered at least partially by the InGaAsP deposits of the interface. The remainder of the emitter portion is masked by the TiWN.

Subsequent to the citric acid/$H_2O_2$ etch, a concentrated solution (12.2M) of HCl was applied in an attempt to etch the exposed substrate. Concentrated HCl is known to etch InGaP. However, as seen in FIG. 6, the presence of the interface layer hindered etching of the underlying InGaP layer, so that etching of the InGaP layer occurred primarily at places where the interface was either particularly thin or non-existent, resulting in partial breakthrough into the InGaP substrate in these areas. The infirmities arising from such an inconsistent etch have been noted above.

The micrograph of FIG. 7 illustrates the effect that the lack of interface etching has on the emitter profile. The device in FIG. 7 resulted from applying the etching sequence set forth in TABLE 3 to a wafer of the general construction set forth in FIG. 3, except that the interface etches were omitted (for purposes of expediency, the ledge formation step was also omitted). As shown in FIG. 7, the resulting profile of the device is irregular due to the masking effect of the interface layers and the isotropic nature of the etch. In particular, the masking effect of the second and third interfaces (moving in the direction from the emitter portion to the base) causes the formation of a prominent ledge of GaAs which is bounded on each of its opposing surfaces by an interface layer. A depression above the ledge is formed by overetching of the first GaAs/InGaP layer pair.

Figure 8:
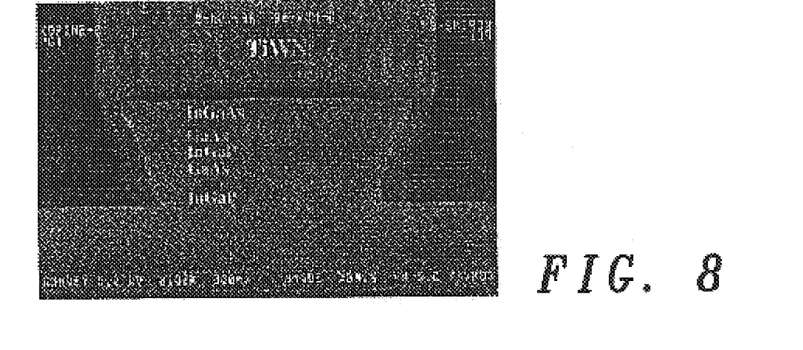

The micrograph of FIG. 8 shows a device having a construction similar to that of the device of FIG. 7. The device of FIG. 8 was etched in a manner similar to that of FIG. 7, except that the interface etches described in TABLE 3 were employed. The volumetric ratios are based on the solutions described in EXAMPLES 1–10. In contrast to the device of FIG. 7, the emitter region of the device depicted in FIG. 8 has a very well-defined profile in which the outer walls are relatively smooth (the downward slope arises from the generally isotropic nature of the etch). This profile demonstrates the ability of the etch sequence to etch the wafer in a very controlled and reliable manner, and thus underscores the ability of the etch sequence to reliably produce HBTs on a mass scale with optimized properties.

Figure 9:
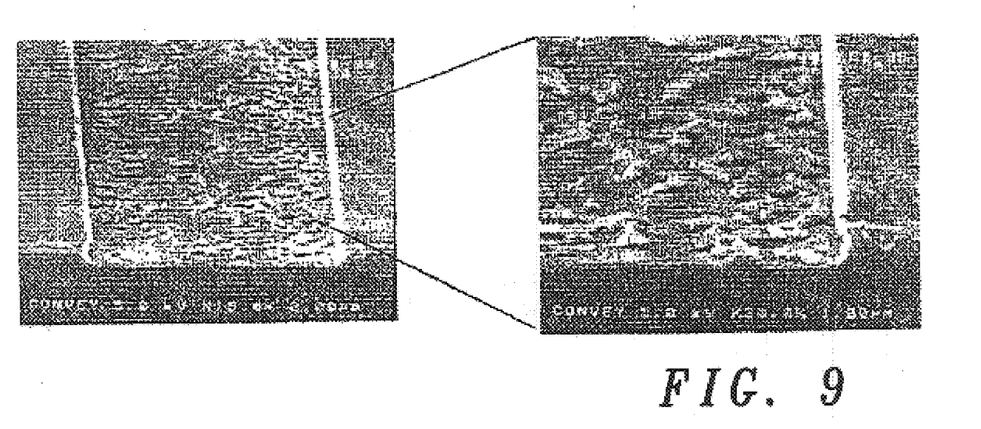
FIG. 9 is a transmission electron micrograph showing the effects of etching a GaAs/InGaP HBT without removal of the interface.
Figure 10:
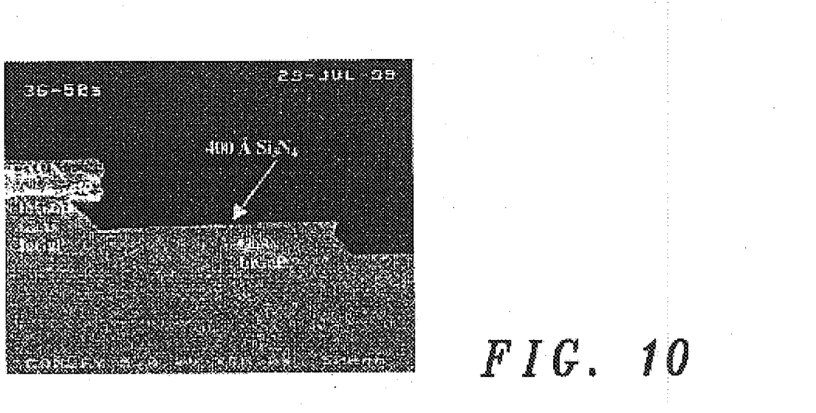
FIG. 10 is a tunneling electron micrograph showing the emitter/ledge wet etch profile of a GaAs/InGaP HBT when the interface is removed.

FIGS. 9 and 10 further illustrate the differences between the results achieved with conventional etching methodologies and those achieved through use of the methodology of the present invention. The device of FIG. 9 resulted when the uppermost InGaP layer of a wafer of the general construction set forth in FIG. 3 was etched across the exposed interface with a concentrated solution of HCl (12.2M) without first removing the interface. A flaky surface resulted because the etch is isotropic and did not effectively remove the InGaAsP deposits existing at the first interface, thus allowing these deposits to mask portions of the underlying InGaP layer. On the other hand, at locations on the exposed interface where these deposits were thin or nonexistent, the HCl etched the underlying InGaP layer isotropically, thereby undercutting these deposits.

Figure 11:
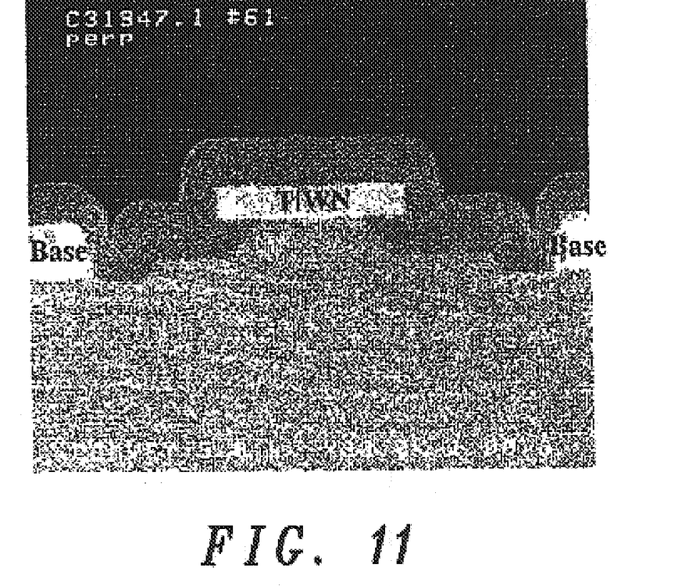
FIGS. 11–12 are tunneling electron micrographs illustrating the results of emitter selective wet etches on HBT wafers.
Figure 12:
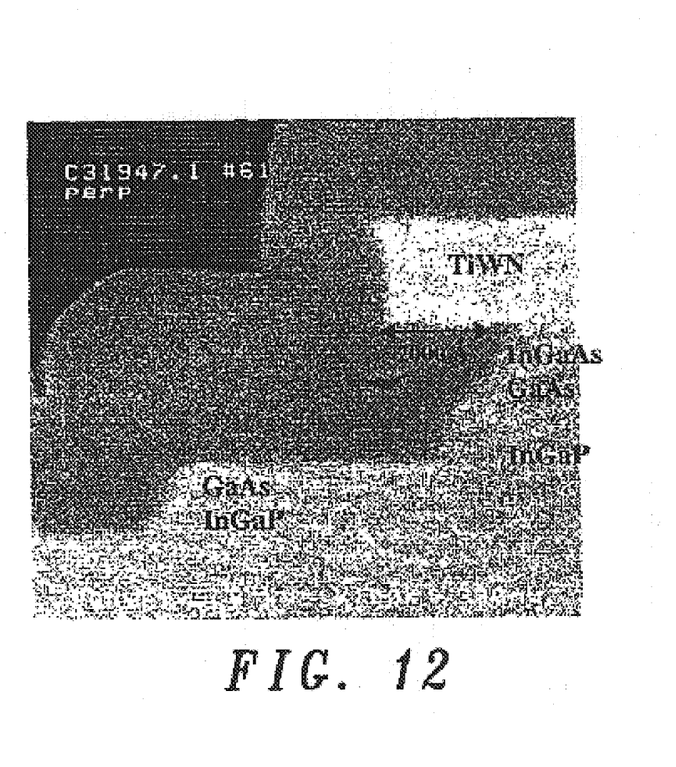

However, when these deposits are first removed by an effective interface etch, the underlying InGaP layer can be etched much more uniformly and controllably, thus resulting in a much smoother emitter profile. This result is depicted in the micrographs of FIGS. 10, 11 and 12. The emitter profiles shown in these micrographs were obtained by using the etch sequence set forth in TABLE 3. In particular, for each GaAs/InGaP layer pair in the wafer, the GaAs layer was first etched with a citric acid/$H_2O_2$ solution which exhibits etch stop behavior on InGaP. The GaAs/InGaP interface was then etched with a dilute HCl/$H_2O_2$ solution before commencing the etch of the InGaP layer. As indicated by these micrographs, the methodology used to form these emitter profiles can be used to reliably fabricate HBTs in a controlled manner. The resulting HBTs have very well defined features and smooth outer surfaces.

As illustrated herein, the present invention has provided a highly reliable fabrication route for the production of quality semiconductor devices based on GaAs/InGaP. The methodologies disclosed herein overcome the infirmities associated with the prior art with respect to etching across GaAs/InGaP interfaces by providing a means for the effective removal of the InGaAsP deposits that occur along these interfaces. By so doing, the consistency of an etch across these interfaces is greatly improved, and standardized etching times can be adopted. Moreover, HBTs can be reliably manufactured in accordance with the invention on a commercial scale, and these devices can be fabricated with more sophisticated, near ideal designs which may contain multiple GaAs/InGaP interfaces.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed solely in reference to the appended claims.

What is claimed is:

1. A method for fabricating a semiconductor device, comprising the steps of:
   providing a substrate containing a first layer comprising GaAs and a second layer comprising InGaP, wherein the first and second layers are joined across a common interface comprising InGaAsP;
   etching the first layer with a first liquid composition until at least a portion of the interface is exposed; and
   etching the interface with a second composition that exhibits etch stop behavior with respect to InGaP, the second composition comprising an oxidizing agent disposed in a liquid medium.

2. The method of claim 1, wherein the semiconductor device is a field effect transistor.

3. The method of claim 1, wherein the semiconductor device is a heterojunction bipolar transistor.

4. The method of claim 1, wherein the second composition is an aqueous solution comprising HCl and $H_2O_2$.

5. The method of claim 4, wherein the second composition is a dilute aqueous solution.

6. The method of claim 4, wherein the mole ratio of $H_2O_2$ to HCl in the solution is within the range of about 1:20 to about 5:4.

7. The method of claim 4, wherein the mole ratio of $H_2O_2$ to HCl in the solution is within the range of about 1:12 to about 3:4.

8. The method of claim 4, wherein the mole ratio of $H_2O_2$ to HCl in the solution is within the range of about 1:12 to about 1:4.

9. The method of claim 1, wherein the InGaAsP has the formula $In_xGa_{1-x}As_yP_{1-y}$, wherein 0<x, y<1.

10. The method of claim 1, wherein the InGaP has the formula $In_xGa_{(1-x)}P$, where 0<x<1.

11. The method of claim 1, wherein the liquid medium is water.

12. The method of claim 1, wherein the first composition exhibits etch stop behavior with respect to InGaP.

13. The method of claim 1, wherein the first and second layers are epitaxial layers.

14. The method of claim 1, wherein the substrate has a plurality of interfaces comprising InGaAsP.

15. The method of claim 14, wherein each of the plurality of interfaces is bounded on a first side by a layer comprising GaAs and is bounded on a second side by a layer comprising InGaP.

16. The method of claim 1, wherein the first and second layers are essentially parallel.

17. The method of claim 1, further comprising the step of etching the second layer with a third liquid composition.

18. The method of claim 17, wherein the third composition comprises a mixture of $H_3PO_4$ and HCl.

19. A method for fabricating a semiconductor device, comprising:
   providing a Group III–V compound heterostructure which includes contiguous first and second epitaxial layers having diverse compositions, said first and second layers comprising, respectively, GaAs and InGaP and having disposed between them an interface comprising InGaAsP;
   subjecting the heterostructure to a first etchant that selectively etches the first layer; and
   subjecting the heterostructure to a second etchant that selectively etches the interface, the second etchant comprising an aqueous solution of $H_2O_2$ having a pH of less than 7.

20. The method of claim 19, wherein the pH of the second etchant is greater than about 5.

21. The method of claim 19, wherein the second etchant further comprises HCl.

22. The method of claim 21, wherein the mole ratio of $H_2O_2$ to HCl in the second etchant is within the range of about 1:20 to about 5:4.

23. The method of claim 21, wherein the mole ratio of $H_2O_2$ to HCl in the second etchant is within the range of about 1:12 to about 3:4.

24. A method for etching a substrate, comprising the steps of:
   providing a substrate comprising formations of $In_xGa_{1-x}As_yP_{1-y}$, wherein 0<x, y<1; and
   etching the formations with a composition comprising a dilute aqueous solution of $H_2O_2$ and HCl.

25. The method of claim 24, wherein the mole ratio of $H_2O_2$ to HCl in the solution is within the range of about 1:20 to about 5:4.

26. The method of claim 24, wherein the mole ratio of $H_2O_2$ to HCl in the solution is within the range of about 1:12 to about 3:4.

27. The method of claim 24, wherein the mole ratio of $H_2O_2$ to HCl in the solution is within the range of about 1:12 to about 1:4.

28. The method of claim 25, wherein the concentration of HCl in the solution is less than about 0.5M.

29. A method for fabricating a field effect transistor, comprising the steps of:
   providing a substrate comprising a plurality of epitaxial layers containing a first layer of GaAs and a second layer of InGaP, said first and second layer having a common interface comprising InGaAsP; and
   etching the interface with a composition comprising an oxidizing agent disposed in a liquid medium.

30. The method of claim 29, wherein the oxidizing agent is a peroxide.

31. The method of claim 30, wherein the peroxide is $H_2O_2$.

32. The method of claim 29, wherein the liquid medium is water.

33. The method of claim 29, wherein the composition comprises $H_2O_2$, HCl and $H_2O$.

34. The method of claim 33, wherein the concentration of HCl in the liquid medium is less than about 0.5M.

35. The method of claim 33, wherein the concentration of HCl in the liquid medium is within the range of about 0.2M to about 0.5M.

* * * * *

UNITED STATES PATENT AND TRADEMARK OFFICE
CERTIFICATE OF CORRECTION

PATENT NO.        : 6,803,248 B2
APPLICATION NO.   : 10/029093
DATED             : October 12, 2004
INVENTOR(S)       : Mariam G. Sadaka et al.

It is certified that error appears in the above-identified patent and that said Letters Patent is hereby corrected as shown below:

After Claim 35, insert dependent claims 36–42 which were added in an Amendment dated January 5, 2004

--36. The method of claim 24, wherein the volumetric ratio of $H_2O$ to HCl in the solution is greater than about 15:1.

37. The method of claim 24, wherein the volumetric ratio of $H_2O$ to HCl in the solution is at least about 20:1.

38. The method of claim 36, wherein the mole ratio of $H_2O_2$ to HCl in the solution is within the range of about 1:12 to about 3:4.

39. The method of claim 36, wherein the mole ratio of $H_2O_2$ to HCl in the solution is within the range of about 1:12 to about 1:4.

40. The method of claim 37, wherein the mole ratio of $H_2O_2$ to HCl in the solution is within the range of about 1:12 to about 3:4.

41. The method of claim 37, wherein the mole ratio of $H_2O_2$ to HCl in the solution is within the range of about 1:12 to about 1:4.

UNITED STATES PATENT AND TRADEMARK OFFICE
CERTIFICATE OF CORRECTION

PATENT NO. : 6,803,248 B2
APPLICATION NO. : 10/029093
DATED : October 12, 2004
INVENTOR(S) : Mariam G. Sadaka et al.

It is certified that error appears in the above-identified patent and that said Letters Patent is hereby corrected as shown below:

42. The method of claim 29, wherein the composition is selective to InGaP.

Signed and Sealed this

Twenty-second Day of May, 2007

JON W. DUDAS
*Director of the United States Patent and Trademark Office*